United States Patent
Collins et al.

(10) Patent No.: US 10,256,406 B2
(45) Date of Patent: Apr. 9, 2019

(54) SEMICONDUCTOR STRUCTURES INCLUDING LINERS AND RELATED METHODS

(71) Applicant: Micron Technology, Inc., Boise, ID (US)

(72) Inventors: Dale W. Collins, Boise, ID (US); Andrea Gotti, Boise, ID (US); F. Daniel Gealy, Kuna, ID (US); Tuman E. Allen, Kuna, ID (US); Swapnil Lengade, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/155,618

(22) Filed: May 16, 2016

(65) Prior Publication Data

US 2017/0331036 A1    Nov. 16, 2017

(51) Int. Cl.
*H01L 45/00* (2006.01)
*H01L 27/24* (2006.01)

(52) U.S. Cl.
CPC ...... *H01L 45/1658* (2013.01); *H01L 27/2427* (2013.01); *H01L 27/2463* (2013.01);
(Continued)

(58) Field of Classification Search
CPC . H01L 45/1658; H01L 45/06; H01L 45/1233; H01L 27/2427; H01L 45/1246; H01L 45/1675; H01L 45/1641; H01L 45/141; H01L 27/1025; H01L 27/10805; H01L 27/10847; H01L 27/10894; H01L 27/11206; H01L 27/11531; H01L 27/11558; H01L 21/8229; H01L 21/8239; H01L 27/1023; H01L 27/1024; H01L 27/1026; H01L 27/1052; H01L 27/108; H01L 27/1101; H01L 27/11502; H01L 27/11521; H01L 27/11529; H01L 27/11568; H01L 27/1159; H01L 27/24; H01L 29/685; H01L 2924/14335; H01L 27/792; H01L 29/8615; H01L 45/04; H01L 2924/13089; H01L 27/10844; H01L 27/11; H01L 27/112; H01L 27/115; H01L 27/1084

See application file for complete search history.

(56) References Cited

U.S. PATENT DOCUMENTS 6,727,192 B2  4/2004  Moore et al.
9,054,295 B2  6/2015  Gotti et al.
(Continued)

*Primary Examiner* — Cuong B Nguyen
*Assistant Examiner* — Samuel Park
(74) *Attorney, Agent, or Firm* — TraskBritt

(57) ABSTRACT

A semiconductor structure includes a plurality of stack structures overlying a substrate. Each stack structure includes a first chalcogenide material over a conductive material overlying the substrate, an electrode over the first chalcogenide material, a second chalcogenide material over the electrode, a liner on sidewalls of at least one of the first chalcogenide material or the second chalcogenide material, and a dielectric material over and in contact with sidewalls of the electrode and in contact with the liner. Related semiconductor devices and systems, methods of forming the semiconductor structure, semiconductor device, and systems, and methods of forming the liner in situ are disclosed.

21 Claims, 9 Drawing Sheets

(52) U.S. Cl.
CPC .......... *H01L 45/06* (2013.01); *H01L 45/1233* (2013.01); *H01L 45/1246* (2013.01); *H01L 45/141* (2013.01); *H01L 45/144* (2013.01); *H01L 45/1641* (2013.01); *H01L 45/1675* (2013.01)

(56) References Cited

U.S. PATENT DOCUMENTS

| | | | | |
|---|---|---|---|---|
| 2006/0091492 A1* | 5/2006 | Lee | ............ | C23C 16/34 257/467 |
| 2007/0158698 A1* | 7/2007 | Dennison | ............ | H01L 45/04 257/246 |
| 2007/0246782 A1* | 10/2007 | Philipp | ............ | H01L 45/06 257/379 |
| 2008/0067486 A1* | 3/2008 | Karpov | ............ | G11C 11/5678 257/3 |
| 2009/0027955 A1* | 1/2009 | Koh | ............ | G11C 13/0007 365/163 |
| 2009/0231910 A1* | 9/2009 | Liu | ............ | H01L 27/2463 365/163 |
| 2010/0133503 A1* | 6/2010 | Kuo | ............ | G11O 5/063 257/5 |
| 2011/0049456 A1* | 3/2011 | Lung | ............ | H01L 45/06 257/2 |
| 2014/0070162 A1* | 3/2014 | Iwayama | ............ | H01L 43/08 257/4 |
| 2015/0076441 A1* | 3/2015 | Jung | ............ | H01L 45/1683 257/4 |
| 2015/0243708 A1 | 8/2015 | Ravasio et al. | | |
| 2015/0243709 A1 | 8/2015 | Song et al. | | |
| 2015/0243884 A1* | 8/2015 | BrightSky | ............ | H01L 45/06 257/4 |
| 2015/0243885 A1 | 8/2015 | Sciarrillo | | |
| 2015/0287916 A1 | 10/2015 | Campbell et al. | | |
| 2015/0318038 A1 | 11/2015 | Hu et al. | | |
| 2015/0318467 A1 | 11/2015 | Hu et al. | | |
| 2015/0318468 A1 | 11/2015 | Chan et al. | | |
| 2016/0012889 A1* | 1/2016 | Shepard | ............ | G11C 13/0069 365/163 |
| 2016/0056208 A1 | 2/2016 | Pellizzer et al. | | |

* cited by examiner

SEMICONDUCTOR STRUCTURES INCLUDING LINERS AND RELATED METHODS

TECHNICAL FIELD

Embodiments disclosed herein relate to semiconductor structures including one or more chalcogenide materials and to methods of forming such structures. More particularly, embodiments of the disclosure relate to semiconductor structures including doped chalcogenide materials and methods of forming in situ a liner on such materials.

BACKGROUND

Nonvolatile memory devices are an important element of electronic systems due to their ability to maintain data absent a power supply. Some nonvolatile memory cells include phase change materials. Phase change materials include chalcogenide compounds, which are capable of stably transitioning between physical states (e.g., amorphous, semi-amorphous, and crystalline states). Each physical state may exhibit a particular resistance that may be used to distinguish a logic value of the memory cell.

Conventional memory cells including the phase change materials may also include a selector device (such as, for example, a switching diode, a threshold switching material, another isolation element, etc.). One type of selector device material may include a chalcogenide compound, such as one exhibiting an OFF state that is relatively resistive and an ON state that is relatively conductive. The ON state may be enabled when a voltage across the selector device material is greater than a critical value of the selector device material.

Fabrication of conventional semiconductor structures including such memory cells often includes creating high aspect ratio openings in a stack of materials comprising the memory cells to form stack structures on a substrate. Frequently, materials that are highly sensitive to downstream processing conditions are used as part of the stack structures. For example, chalcogenide materials of the phase change material, the selector device material, or both, may be damaged at temperatures used during conventional semiconductor fabrication processes or may react with etchant or deposition chemistries used during downstream processing. The chalcogenide materials may also diffuse out of the chalcogenide material during etching or material formation (e.g., deposition) acts. In some situations, the chalcogenide material may undesirably have a different composition after fabrication of the semiconductor structure than an as-deposited chalcogenide material.

To overcome such problems, liners have been formed over sidewalls of the stack structures including the reactive chalcogenide materials. However, deposition of a liner material increases fabrication time and cost. In addition, deposition of such liner materials may negatively affect the thermal budget and alter a composition of the chalcogenide materials by, for example, diffusion. Further, chalcogenide materials of the phase change material, the selector device material, or both, may react with deposition chemistries or etch chemistries used during respective deposition or etching of the liner materials. Further, as-deposited liner materials may delaminate from surfaces of the chalcogenide and the stack structures and may not, therefore, effectively passivate the chalcogenide materials.

DETAILED DESCRIPTION

Figure 1:
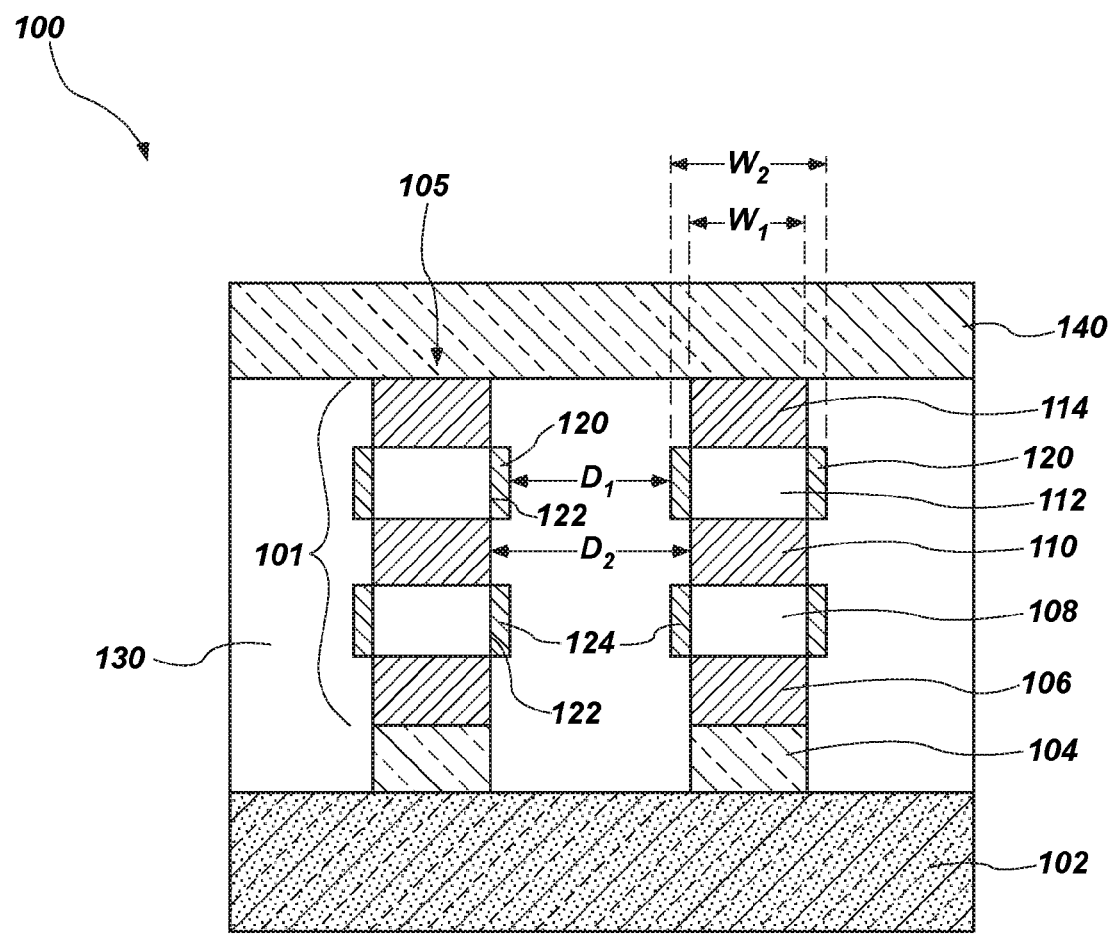
FIG. 1 is a simplified cross-sectional view of a semiconductor structure including a plurality of phase change memory cells including a chalcogenide material, in accordance with an embodiment of the disclosure.

The illustrations included herewith are not meant to be actual views of any particular systems or semiconductor structures, but are merely idealized representations that are employed to describe embodiments herein. Elements and features common between figures may retain the same numerical designation except that, for ease of following the description, for the most part, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of a semiconductor structure or a complete process flow for manufacturing semiconductor structures and the structures described below do not form a complete semiconductor structure. Only those process acts and structures necessary to understand the embodiments described herein are described in detail below. Additional acts to form a complete semiconductor structure including the structures described herein may be performed by conventional techniques.

According to embodiments disclosed herein, one or more chalcogenide materials may be doped with one or more materials formulated and configured to form in situ a liner on sidewalls of the chalcogenide material during patterning of the chalcogenide material. In some embodiments, a chalcogenide material (e.g., a phase change material, a selector device material, etc.) may be doped with, for example, aluminum, indium, chromium, nickel, zirconium, hafnium, tantalum, vanadium, silicon, tellurides thereof (e.g., aluminum telluride (AlTe)), or combinations thereof. During patterning of stack structures including the chalcogenide material, the dopants may diffuse in situ to exposed sidewalls of the material, may re-sputter in situ on exposed sidewalls of the material (e.g., may not be volatilized by etch chemistries during etching of materials including the dopants), or both. The dopants may be oxidized or nitrided in situ and form a liner on the sidewalls of the chalcogenide material. The liner may protect the chalcogenide material during subsequent fabrication of the semiconductor structure. As used herein, the team "nitrided" means and includes exposing a material to a nitrogen source at conditions sufficient to form a nitride of the material. By way of nonlimiting example, a liner comprising aluminum may be nitrided to form a liner comprising aluminum nitride.

FIG. 1 is a cross-sectional view of a semiconductor structure 100 including one or more liners, according to embodiments of the disclosure. The semiconductor structure 100 may include a plurality of stack structures 105 formed over a substrate 102. The substrate 102 may be a base material or a construction upon which additional materials are formed. The substrate 102 may be a semiconductor substrate, a base semiconductor layer on a supporting structure, a metal electrode or a semiconductor substrate having one or more layers, structures or regions formed thereon. The substrate 102 may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate 102 may be doped or undoped.

A conductive material 104 may overlie the substrate 102. A bottom electrode 106 may overlie the conductive material 104. A selector device 108 (e.g., a switching diode material, a threshold switching material) may overlie the bottom electrode 106. In some embodiments, the selector device 108 directly overlies and contacts the bottom electrode 106. A middle electrode 110 may overlie the selector device 108 and may be disposed between the selector device 108 and a phase change material 112 overlying the middle electrode 110. In some embodiments, the phase change material 112 may directly overlie and contact the middle electrode 110. A top electrode 114 may overlie the phase change material 112. A memory cell 101, such as a phase change memory cell, may comprise the bottom electrode 106, the selector device 108, the middle electrode 110, the phase change material 112, and the top electrode 114.

The conductive material 104 may include any electrically conductive material including, but not limited to, tungsten, aluminum, copper, titanium, tantalum, platinum, alloys thereof, heavily doped semiconductor material, polysilicon, a conductive silicide, a conductive nitride, a conductive carbide, or combinations thereof. In some embodiments, the conductive material 104 is tungsten. In some embodiments, the conductive material 104 may comprise an access line, such as a word line.

The bottom electrode 106, the middle electrode 110, and the top electrode 114 may each comprise the same material or different materials. The bottom electrode 106, the middle electrode 110, and the top electrode 114 may include a conductive material such as, for example, tungsten, platinum, palladium, tantalum, nickel, titanium nitride (TiN), tantalum nitride (TaN), tungsten nitride (WN), polysilicon, a metal silicide, or a carbon material. In some embodiments, one or more of the bottom electrode 106, the middle electrode 110, or the top electrode 114 comprises carbon.

The selector device 108 may comprise a chalcogenide material, such as a chalcogenide glass, a chalcogenide-metal ion glass, or other chalcogenide-containing materials. As used herein, the term "chalcogenide material" means and includes a binary or multinary (ternary, quaternary, etc.) compound including at least one chalcogenide atom and at least one more electropositive element. As used herein, the term "chalcogenide" means and includes an element of Group VI of the Periodic Table, such as oxygen (O), sulfur (S), selenium (Se), or tellurium (Te). The electropositive element may include, but is not necessarily limited to, nitrogen (N), silicon (Si), nickel (Ni), gallium (Ga), germanium (Ge), arsenic (As), silver (Ag), indium (In), tin (Sn), antimony (Sb), gold (Au), lead (Pb), bismuth (Bi), or combinations thereof. In some embodiments, the chalcogenide material includes a compound including Ge, Sb, and Te (i.e., a GST compound), such as $Ge_2Sb_2Te_5$, however, the disclosure is not so limited and the chalcogenide material may include other compounds including at least one chalcogenide element.

The phase change material 112 may include a chalcogenide material and may include one or more chalcogenides, as described above with reference to the selector device 108. In some embodiments, the phase change material 112 may comprise the same chalcogenide material as the selector device 108. In other embodiments, the phase change material 112 comprises a different chalcogenide material than the selector device 108.

A first liner 120 may overlie sidewalls 122 of the phase change material 112 and a second liner 124 may overlie sidewalls 122 of the selector device 108. As will be described herein, the first liner 120 and the second liner 124 may include a material formulated and configured to substantially protect the phase change material 112 and the selector device 108, respectively, from undesired reactions or interactions with other materials during fabrication of the semiconductor structure 100. For example, the chalcogenide material of one or more of the selector device 108 or the phase change material 112 may be undesirably reactive during fabrication acts of the semiconductor structure 100. In some embodiments, one or more materials (e.g., elements) of the chalcogenide material may diffuse therefrom or react with one or more other materials during etching or material formation during fabrication of the semiconductor structure 100. Accordingly, the first liner 120 and the second liner 124 may be formulated and configured to passivate (e.g., protect) each of the phase change material 112 and the selector device 108, respectively, during fabrication of the semiconductor structure 100.

Each of the first liner 120 and the second liner 124 may comprise a material configured and formulated to exhibit a high etch selectivity relative to other materials in the stack structures 105. Stated another way, the material of the first liner 120 and the second liner 124 may be selected such that the first liner 120 and the second liner 124 are not substantially removed during patterning or removal of one or more other materials of the stack structures 105. In addition, the material of the first liner 120 and the second liner 124 may not substantially react with chalcogenides of the phase change material 112 or the selector device 108.

In some embodiments, the first liner 120 and the second liner 124 may include the same material. In other embodiments, the first liner 120 and the second liner 124 comprise a different material. The first liner 120 and the second liner 124 may each independently comprise aluminum, indium, chromium, nickel, zirconium, hafnium, tantalum, vanadium, silicon, tellurides thereof (e.g., aluminum telluride (AlTe)), oxides thereof, nitrides thereof, or combinations thereof. In some embodiments, the first liner 120 and the second liner 124 may include a high dielectric constant (a high-k) oxide, such as, for example, an aluminum oxide (e.g., $Al_2O_3$), an indium oxide (e.g., $In_2O_3$), a chromium oxide, a nickel oxide, a zirconium oxide, a hafnium oxide, a tantalum oxide, a vanadium oxide, a silicon oxide, tellurides thereof, or combinations thereof. In other embodiments, the first liner 120 and the second liner 124 may comprise, for example, aluminum nitride, indium nitride, chromium nitride, nickel nitride, zirconium nitride, hafnium nitride, tantalum nitride, vanadium nitride, silicon nitride, or combinations thereof. In some embodiments, the first liner 120 and the second liner 124 may include an aluminum oxide or an aluminum nitride. Where the first liner 120 and the second liner 124 comprise aluminum oxide, the aluminum oxide may include stoichiometric amount of aluminum and oxygen, while, in other embodiments, the aluminum oxide may be aluminum rich or oxygen rich. In some embodiments, one or more of the first liner 120 or the second liner 124 may comprise a higher atomic percent of the oxygen at exposed surfaces of the sidewall 122 than proximate the phase change material 112 or the selector device 108.

As will be described herein, the first liner 120 and the second liner 124 may include a material or an oxide or a nitride of a material with which the selector device 108 and the phase change material 112, respectively, are doped (e.g., aluminum, indium, chromium, nickel, zirconium, hafnium, tantalum, vanadium, silicon). In some embodiments, a material of at least one of the selector device 108 or the phase change material 112 may include a dopant comprising the same material as the respective liner 120, 124. In some embodiments, the first liner 120 and the second liner 124 are comprised of the dopant. In other embodiments, the dopant is oxidized or nitrided and the first liner 120 and the second liner 124 are comprised of an oxide or a nitride of the dopant. By way of nonlimiting example, if the first liner 120 comprises aluminum oxide, the phase change material 112 may include aluminum atoms. However, the disclosure is not so limited and the phase change material 112 or the selector device 108 may be free of the dopant material. In some embodiments, the dopant is oxidized or nitrided in situ in an oxidizing or nitriding environment in an etch chamber during patterning of the semiconductor structure 100. In other embodiments, the dopant is oxidized or nitrided ex situ, after patterning the semiconductor structure 100.

The first liner 120 and the second liner 124 may have a thickness between about 0.1 nm and about 3.0 nm, such as between about 0.1 nm and about 0.5 nm, between about 0.5 nm and about 1.0 nm, between about 1.0 nm and about 2.0 nm, or between about 2.0 nm and about 3.0 nm. In some embodiments, the first liner 120 and the second liner 124 have the same thickness. In other embodiments, the first liner 120 and the second liner 124 have a different thickness.

A dielectric material 130 may be disposed between adjacent stack structures 105 of the semiconductor structure 100. The dielectric material 130 may include any suitable material for isolating the stack structures 105 from each other. The dielectric material 130 may include silicon oxide (e.g., $SiO_2$ glass), silicon nitride, silicon oxynitride, a spin-on-glass (SOG), a phosphosilicate glass (PSG), or borophosphosilicate glass (BPSG). In some embodiments, the dielectric material 130 comprises silicon dioxide.

The dielectric material 130 may directly contact each of the top electrode 114, the first liner 120, the middle electrode 110, the second liner 124, the bottom electrode 106, and the conductive material 104. In some embodiments, because of the first liner 120 and the second liner 124, the dielectric material 130 may not be in contact with the selector device 108 or the phase change material 112. Stated another way, the first liner 120 may intervene between the phase change material 112 and the dielectric material 130 and the second liner 124 may intervene between the selector device 108 and the dielectric material 130. It is contemplated that in some embodiments, at least a portion of the first liner 120 or the second liner 124 may contact at least one or more other portions of the stack structures 105.

A lateral thickness of the dielectric material 130 between adjacent stack structures 105 may be different along different portions of the stack structures 105. For example, a lateral thickness of the dielectric material 130 between the first liner 120 on a first stack structure 105 and the first liner 120 on a second stack structure 105 adjacent to the first stack structure 105 (i.e., $D_1$ in FIG. 1) may be less than a thickness of the dielectric material 130 between another portion of the first stack structure 105 and a corresponding portion of the second stack structure 105 (such as between, for example, the middle electrode 110 of the first stack structure 105 and the middle electrode 110 of the second stack structure 105) (i.e., $D_2$ in FIG. 1)).

Similarly, a width of the stack structure 105 may be greater at the location of the first liner 120 and the second liner 124 than at other portions of the stack structure 105. For example, width $W_1$ may be less than width $W_2$.

Although FIG. 1 has been described as including the phase change material 112 overlying the selector device 108, the disclosure is not so limited. In other embodiments, a location of the phase change material 112 and the selector device 108 may be reversed. In some such embodiments, the phase change material 112 may be disposed directly between the bottom electrode 106 and the middle electrode 110 while the selector device 108 is disposed directly between the middle electrode 110 and the top electrode 114. In some such embodiments, the stack structure 105 may include the selector device 108 directly over and in contact with the middle electrode 110 and the phase change material 112 directly over and in contact with the bottom electrode 106.

Although FIG. 1 illustrates the first liner 120 and the second liner 124 on the phase change material 112 and the selector device 108, respectively, the disclosure is not so limited. In some embodiments, the stack structures 105 may include only the first liner 120 on the phase change material 112. In some such embodiments, the selector device 108 may directly contact the dielectric material 130. In other embodiments, the stack structures 105 may include only the second liner 124 on the selector device 108. In some such embodiments, the phase change material 112 may directly contact the dielectric material 130. In some embodiments, only an upper one of the phase change material 112 or the selector device 108 may include sidewalls 122 having a liner thereon.

Another conductive material 140 may overlie the dielectric material 130 and the stack structures 105. The another conductive material 140 may comprise any electrically conductive material including, but not limited to, tungsten, aluminum, copper, titanium, tantalum, platinum, alloys thereof, heavily doped semiconductor material, polysilicon, a conductive silicide, a conductive nitride, a conductive carbide, or combinations thereof. In some embodiments, the another conductive material 140 comprises the same material as the conductive material 104. The another conductive material 140 may comprise an access line, such as a bit line. In some embodiments, the another conductive material 140 extends in a direction that is orthogonal to a direction of the conductive material 104.

Accordingly, in one embodiment, a semiconductor structure comprises a first chalcogenide material over a conductive material overlying a substrate, an electrode over the first chalcogenide material, a second chalcogenide material over the electrode, a liner on sidewalls of at least one of the first chalcogenide material or the second chalcogenide material, and a dielectric material over and in contact with sidewalls of the electrode and in contact with the liner.

Accordingly, in another embodiment, a semiconductor device comprises a memory array comprising a plurality of memory cells, at least one memory cell of the plurality of memory cells comprising a first electrode over a substrate, a phase change material comprising a chalcogenide over the first electrode, a liner on sidewalls of the phase change material, and a dielectric material on sidewalls of the first electrode.

Figure 2A:
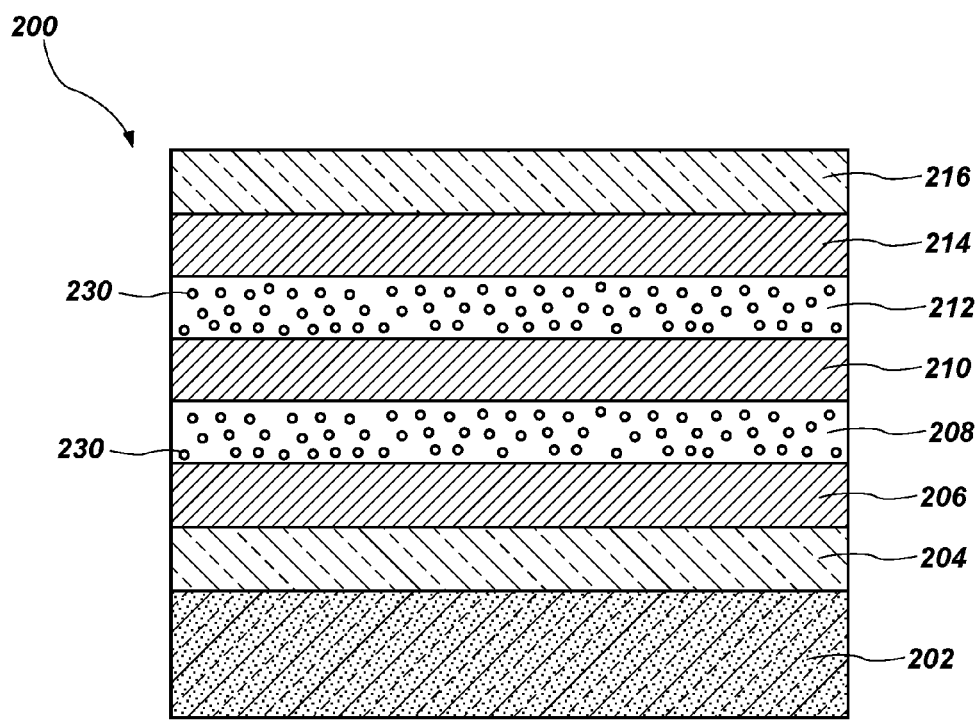
FIG. 2A through FIG. 2D illustrate a method of fabricating a semiconductor structure including stack structures having a liner on sidewalls of a chalcogenide material, in accordance with an embodiment of the disclosure.

FIG. 2A through FIG. 2D illustrate a method of forming the semiconductor structure 100 (FIG. 1). Referring to FIG. 2A, a semiconductor structure 200 may include various materials formed over a substrate 202. The substrate 202 may be substantially similar to the substrate 102 described above with reference to FIG. 1.

A conductive material 204 may be formed over the substrate 202, a bottom electrode material 206 may be formed over the conductive material 204, a selector device material 208 may be formed over the bottom electrode material 206, a middle electrode material 210 may be formed over the selector device material 208, a phase change material 212 may be formed over the middle electrode material 210, a top electrode material 214 may be formed over the phase change material 212, and a hard mask material 216 may be formed over the top electrode material 214. Each of the conductive material 204, the bottom electrode material 206, the selector device material 208, the middle electrode material 210, the phase change material 212, and the top electrode material 214 may be substantially similar to the conductive material 104, the bottom electrode 106, the selector device 108, the middle electrode 110, the phase change material 112, and the top electrode 114, respectively, described above with reference to FIG. 1. The hard mask material 216 may comprise a nitride material such as silicon nitride ($Si_3N_4$) or other suitable mask material for forming patterns in the semiconductor structure 200.

In some embodiments, at least one of the selector device material 208 or the phase change material 212 may include a chalcogenide material, such as, for example, GST. In other embodiments, each of the selector device material 208 and the phase change material 212 comprises GST.

Each of the conductive material 204, the bottom electrode material 206, the selector device material 208, the middle electrode material 210, the phase change material 212, the top electrode material 214, and the hard mask material 216 may be formed by conventional techniques, such as physical vapor deposition (PVD), chemical vapor deposition (CVD), or atomic layer deposition (ALD). Such techniques are known in the art and, therefore, are not described in detail herein.

The selector device material 208 and the phase change material 212 may include one or more dopants 230 therein.

The dopant 230 may be substantially uniformly dispersed throughout the selector device material 208. In other embodiments, it is contemplated that the selector device material 208 exhibits a gradient of the dopant 230 material therein.

The dopant 230 may be formulated and configured to form the first liner 120 (FIG. 1) on sidewalls 122 (FIG. 1) of the phase change material 112 (FIG. 1) during subsequent patterning of the selector device material 208. The dopant 230 may include materials formulated and configured to form the first liner 120 during downstream fabrication acts such as patterning of the stack structures 105 (FIG. 1).

The dopant 230 may include, for example, aluminum, indium, chromium, nickel, zirconium, hafnium, tantalum, vanadium, silicon, tellurides thereof, combinations thereof, or other elements or compounds formulated and configured to form an oxide or a nitride thereof, the oxide or nitride exhibiting a relatively high etch selectivity relative to at least one material of the stack structures 105 (FIG. 1). Stated another way, the oxide or nitride of the dopant 230 element or compound may not be substantially removed during material removal of at least one material of the stack structures 105. In some embodiments, the dopant 230 may be selected to exhibit a desired increase in volume responsive to being oxidized or nitrided. In some embodiments, the dopant 230 is selected based on a desired Pilling-Bedworth ratio (i.e., a ratio of volume of an elementary cell of a metal oxide to a volume of an elementary cell of the corresponding metal). In some embodiments, the dopant 230 includes aluminum. In some embodiments, the selector device material 208 may be doped with more than one type of dopant 230. In some such other embodiments, the selector device material 208 may be doped with aluminum and at least one more dopant 230. In some embodiments, the dopant 230 may be oxidized or nitrided in situ by mild oxidation or nitriding during or after patterning of the stack structures 105 to form a liner.

The dopant 230 may be formed in the selector device material 208 substantially concurrently with forming the selector device material 208 over the bottom electrode material 206. For example, after forming the selector device material 208 over the bottom electrode material 206 and prior to forming the middle electrode material 210 over the selector device material 208, the selector device material 208 may be doped by conventional techniques, which are not described in detail herein. Thereafter, the middle electrode material 210 may be formed over the doped selector device material 208.

The dopant 230 may constitute between about 0.1 atomic percent and about 10.0 atomic percent of the selector device material 208, such as between about 0.1 atomic percent and about 0.5 atomic percent, between about 0.5 atomic percent and about 1.0 atomic percent, between about 1.0 atomic percent and about 3.0 atomic percent, between about 3.0 atomic percent and about 5.0 atomic percent, or between about 5.0 atomic percent and about 10.0 atomic percent.

The phase change material 212 may also be doped with one or more dopants 230. In some embodiments, the phase change material 212 is doped with the same material as the selector device material 208. In other embodiments, the phase change material 212 is doped with a different material than the selector device material 208. The phase change material 212 may include about the same concentration of the dopant 230 as the selector device material 208. For example, the dopant 230 may constitute between about 0.1 atomic percent and about 10.0 atomic percent of the phase change material 212.

The dopant 230 may be formed in the phase change material 212 by conventional techniques after the phase change material 212 is formed over the middle electrode material 210 and prior to forming the top electrode material 214 over the phase change material 212.

Figure 2B:
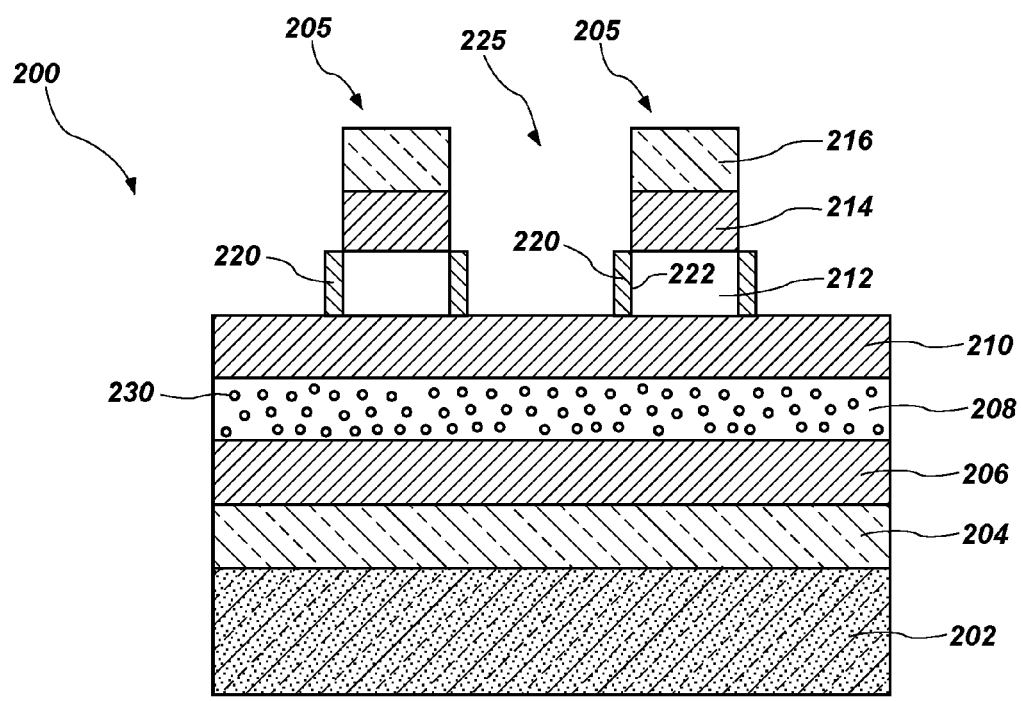

Referring to FIG. 2B, patterning of the semiconductor structure 200 may include forming stack structures 205 over the substrate 202, adjacent stack structures 205 separated by openings 225. A portion of the hard mask material 216 may be removed to form a pattern in the hard mask material 216 and the openings 225 between adjacent portions of the patterned hard mask material 216. Methods of patterning hard mask materials, such as photolithography, are known by those of ordinary skill in the art and are, therefore, not described in detail herein.

Portions of the top electrode material 214 exposed through the openings 225 in the hard mask material 216 may be removed. For example, portions of the top electrode material 214 may be exposed to a dry etchant comprising, for example, at least one of oxygen gas ($O_2$), hydrogen bromide (HBr), ammonia ($NH_3$), hydrogen ($H_2$), or other etchant formulated and configured to remove portions of the top electrode material 214.

With continued reference to FIG. 2B, portions of the phase change material 212 may be removed. The phase change material 212 may be removed with a dry etchant including, for example, a plasma comprising nitrogen ($N_2$) and methane ($CH_4$). In some embodiments, the plasma may further include argon (Ar). The etching may be performed at a temperature between about 25° C. and about 100° C., such as at about 60° C. In other embodiments, the etchant may include a plasma including other materials suitable for removing the phase change material 212.

During etching of the phase change material 212, a first liner 220 may form in situ on sidewalls 222 of the phase change material 212. The first liner 220 may be substantially the same as the first liner 120 described above with reference to FIG. 1. The first liner 220 may comprise the dopants 230 of the phase change material 212, oxides thereof, or nitrides thereof. Accordingly, the first liner 220 may comprise one or more of aluminum, indium, chromium, nickel, zirconium, hafnium, tantalum, vanadium, silicon, tellurides thereof, oxides thereof, nitrides thereof, or combinations thereof.

While the disclosure is not so limited, it is believed that the etching conditions (e.g., temperature, pressure, plasma conditions, etc.) at which the phase change material 212 is removed facilitate formation in situ of the liner 220 from the dopants 230 within the phase change material 212.

Figure 3A:
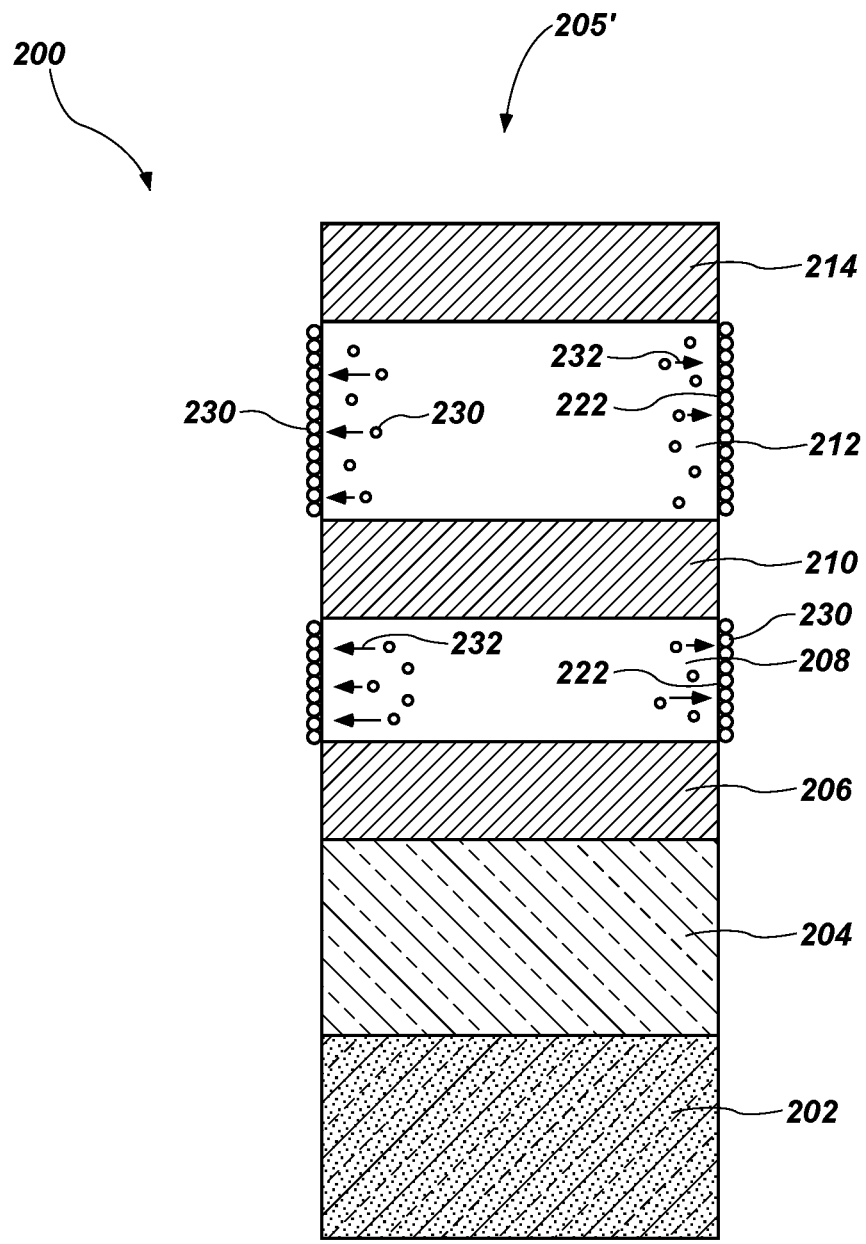
FIG. 3A and FIG. 3B are simplified cross-sectional views illustrating a method of forming the liner on sidewalls of the chalcogenide material, in accordance with an embodiment of the disclosure.
Figure 3B:
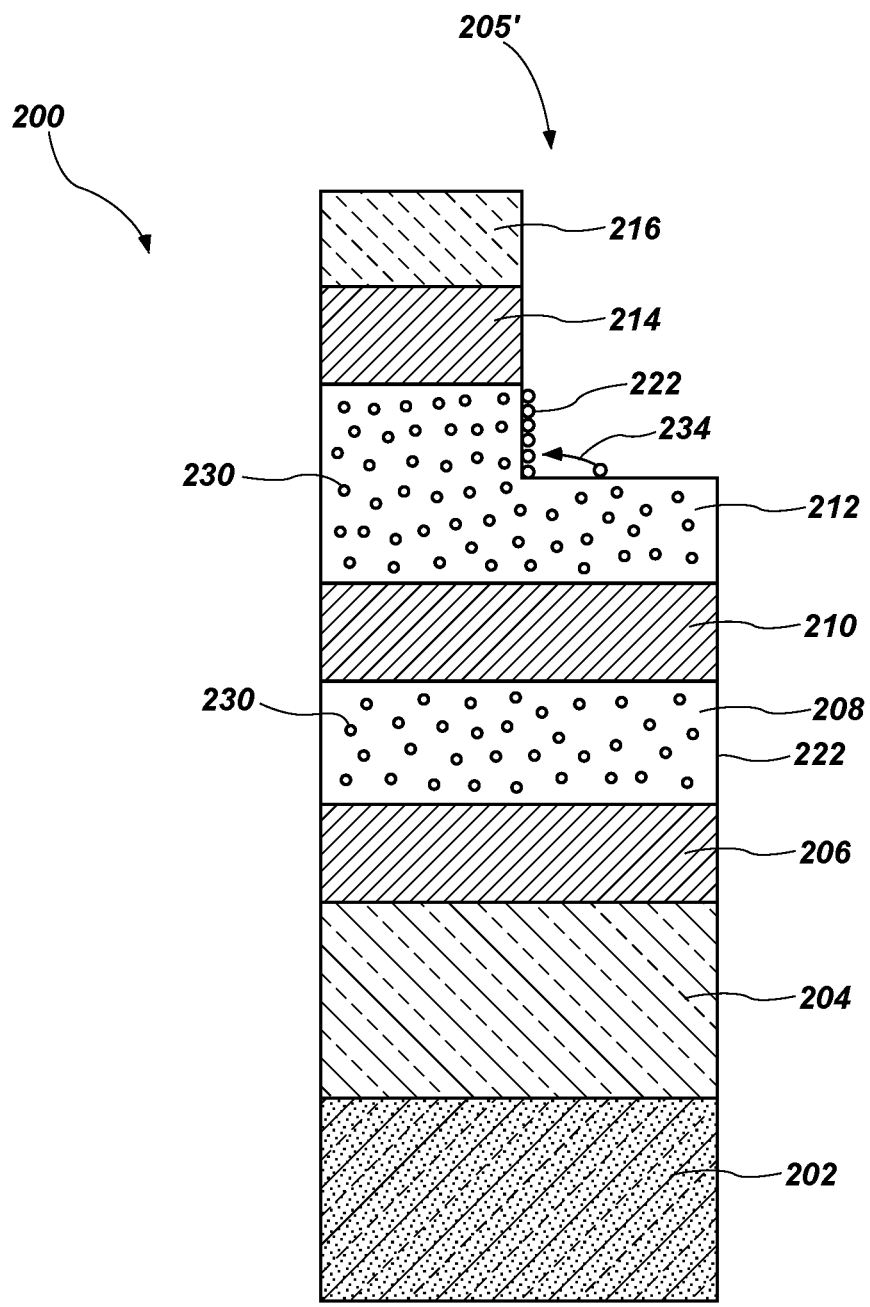

Without wishing to be bound by any particular theory, it is believed that the first liner 220 is formed by one or both of re-sputtering of the dopant 230 of the phase change material 212 on sidewalls 222 of the phase change material 212 or diffusion of the dopant 230 through the phase change material 212 to the sidewalls 222. It is believed that at least a portion of the dopants 230 within the phase change material 212 that are removed during patterning are re-sputtered on the sidewalls 222 of the remaining phase change material 212. For example, it is believed that by selecting the etch chemistry used to etch the phase change material 212 such that the dopant 230 does not substantially volatilize during etching of the phase change material 212, the dopant 230 is re-sputtered on the sidewalls 222. It is further believed that the dopants 230 within the phase change material 212 of the stack structures 205 diffuse preferentially to exposed sidewalls 222 of the phase change material 212 while the dopants 230 are simultaneously re-sputtered at the sidewalls 222. Accordingly, a thickness of the in situ first liner 220 may be enhanced by selection of the dopant 230, an etch chemistry formulated and configured to poorly volatilize the dopant 230, or both. Since the first liner 220 is formed in situ from the dopant 230 that is already in the phase change material 212, the first liner 220 may exhibit an improved adhesion to the sidewalls 222 compared to liners formed by deposition processes. For example, referring to FIG. 3A, a partially formed stack structure 205' over the substrate 202 is illustrated. During patterning of the semiconductor structure 200, the dopant 230 may preferentially migrate from the phase change material 212 and the selector device material 208 to exposed sidewalls 222 of the phase change material 212 and the selector device material 208, as indicated at arrows 232. Referring to FIG. 3B, during patterning (e.g., etching) of the phase change material 212, the dopant 230 may re-sputter on sidewalls 222 of the phase change material 212, as indicated at arrow 234. The dopant 230 may similarly re-sputter on sidewalls 222 of the selector device material 208 during patterning thereof. In some embodiments, it is contemplated that at least some of the dopant 230 diffuses from the phase change material 212 and the selector device material 208 and at least some of the dopant 230 re-sputters from the phase change material 212 and the selector device material 208 during patterning thereof.

Referring back to FIG. 2B, the first liner 220 may be formed only on sidewalls 222 of the phase change material 212, at least because the adjacent materials of the stack structure 205 (i.e., the top electrode material 214 and the middle electrode material 210) are not doped with the material from which the first liner 220 is formed. In addition, the adjacent materials of the stack structure 205 are not reactive under etching conditions. Thus, other portions of the sidewalls 222 may be substantially free of the first liner 220. Stated another way, the first liner 220 may not overlie or contact, for example, the top electrode material 214 or the middle electrode material 210. In some embodiments, the first liner 220 extends from a lower portion of the top electrode material 214 (i.e., an interface of the top electrode material 214 and the phase change material 212) to an upper surface of the middle electrode material 210 (i.e., an interface of the phase change material 212 and the middle electrode material 210).

In some embodiments, a majority, if not all, of the dopants 230 in the phase change material 212 are diffused, re-sputtered, or both from the phase change material 212 to the sidewalls 222 thereof. Accordingly, in some such embodiments, the phase change material 212 may be substantially free of the dopant 230 after the phase change material 212 is patterned. In other embodiments, the phase change material 212 may include at least some of the dopant 230 material therein after the phase change material 212 has been patterned.

The first liner 220 may be oxidized or nitrided after forming the dopant on the sidewalls 222 of the phase change material 212. In some embodiments, the first liner 220 is oxidized or nitrided during downstream fabrication acts. For example, the first liner 220 may be oxidized during formation of the dielectric material 130 (FIG. 1) or during removal of one or more of the middle electrode material 210, the selector device material 208, the bottom electrode material 206, or the conductive material 204. In other embodiments, the first liner 220 may be oxidized or nitrided simultaneously with formation of the dopant 230 on the sidewalls 222. In other embodiments, the first liner 220 may be oxidized after formation of the dopant 230 on the sidewalls 222. In some such embodiments, the first liner 220 may be oxidized or nitrided immediately after patterning of the stack structures 205, such as by altering a chemistry in an etch chamber to a mildly oxidizing chemistry (e.g., $O_2$, $H_2O$, $N_2O$, or another oxidizer) or to a chemistry formulated to nitride the first liner 220 (e.g., a nitrogen ($N_2$) plasma). Responsive to being oxidized or nitrided, the first liner 220 may exhibit a volume expansion. In some embodiments, the first liner 220 exhibits a volume expansion between about 150% and about 350%.

Figure 2C:
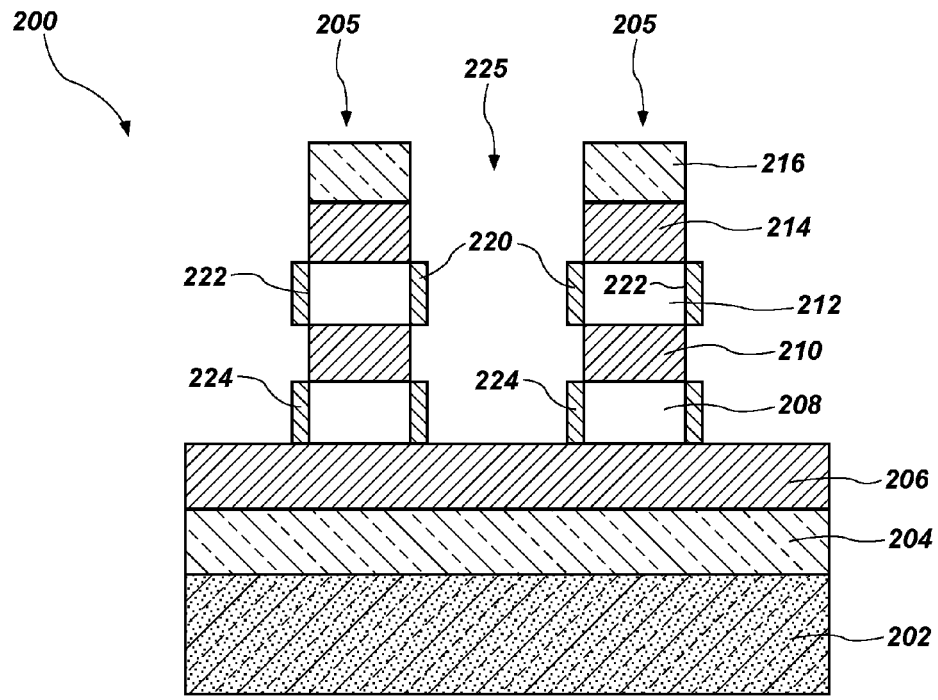

Referring to FIG. 2C, after patterning the phase change material 212, portions of the underlying middle electrode material 210 may be removed. Removal of the middle electrode material 210 may be substantially similar to removal of the top electrode material 214 previously described.

After removing portions of the middle electrode material 210, portions of the selector device material 208 may be removed. In some embodiments, removal of the selector device material 208 may be substantially similar to removal of the phase change material 212.

The selector device material 208 may include one or more dopants 230 (FIG. 2A). During patterning of the selector device material 208, a second liner 224 may be formed in situ on sidewalls 222 of the selector device material 208. The second liner 224 may be substantially the same as the second liner 124 described above with reference to FIG. 1. For example, the second liner 224 may comprise the dopant 230 of the selector device material 208, an oxide thereof, of a nitride thereof. In some embodiments, the dopant 230 of the selector device material 208 is selected such that the second liner 224 exhibits a desired etch selectivity relative to materials of the semiconductor structure 200.

The second liner 224 may overlie the sidewalls 222 of the selector device material 208 and may not contact the middle electrode material 210 or the bottom electrode material 206. Stated another way, the second liner 224 may extend from a lower surface of the middle electrode material 210 (i.e., an interface of the middle electrode material 210 and the selector device material 208) to an upper surface of the bottom electrode material 206 (i.e., an interface of the selector device material 208 and the bottom electrode material 206).

In some embodiments, a majority, if not all, of the dopant 230 in the selector device material 208 is diffused, re-sputtered, or both from the selector device material 208 to the sidewalls 222 thereof to form the second liner 224 in situ, similar to the method described above with reference to formation of the first liner 220. Accordingly, in some such embodiments, the selector device material 208 may be substantially free of the dopant 230 after the selector device material 208 is patterned. In other embodiments, the selector device material 208 may include at least some of the dopant 230 therein after the selector device material 208 has been etched.

A thickness of the first liner 220 and a thickness of the second liner 224 may depend, at least in part, on a concentration of the dopant 230 in the phase change material 212 and the selector device material 208, respectively and on a type of dopant 230 in each of the phase change material 212 and the selector device material 208, respectively. Thus, in some embodiments, the first liner 220 may have a different thickness than a thickness of the second liner 224, depending on a concentration of the dopant 230, a type of the dopant 230, or both in each of the phase change material 212 and the selector device material 208. In some embodiments, the phase change material 212 and the selector device material 208 may be doped with a different dopant 230, a different concentration of the dopant 230, or both.

Figure 2D:
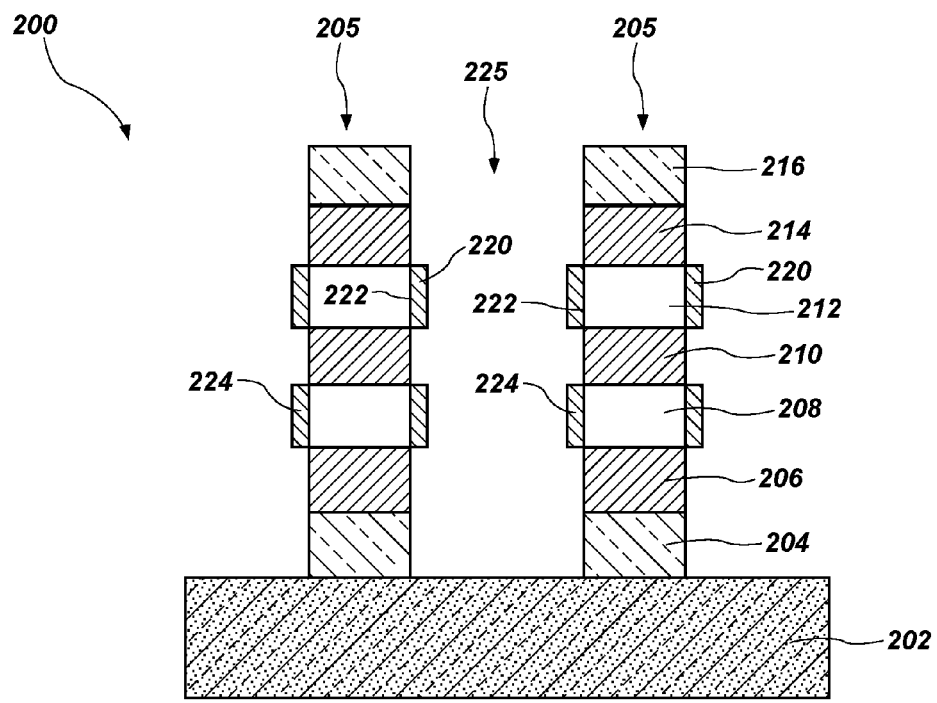

With reference to FIG. 2D, after removing portions of the selector device material 208 and forming the second liner 224 in situ on sidewalls 222 of the stack structures 205, portions of the bottom electrode material 206 and the conductive material 204 may be removed. The bottom electrode material 206 may be removed in a manner substantially similar to removal of the top electrode material 214 and the middle electrode material 210.

The conductive material 204 may be removed with a wet etchant including, for example, hydrofluoric acid, nitric acid, ammonium hydroxide and hydrogen peroxide, hydrochloric acid, sulfuric acid, or combinations thereof. In other embodiments, the conductive material 204 may be removed with a dry etchant such as $SF_6$, $O_2$, $CHF_3$, $CF_4$, $NF_3$, or combinations thereof.

In some embodiments, the bottom electrode material 206 and the conductive material 204 may be removed with more aggressive etch chemistries than used during conventional methods that do not include the liners 220, 224. The first liner 220 and the second liner 224 may protect the phase change material 212 and the selector device material 208, respectively, from being exposed to such aggressive etch chemistries.

With continued reference to FIG. 2D, the hard mask material 216 may be removed from over the stack structures 205 after patterning the conductive material 204. A dielectric material (e.g. the dielectric material 130 (FIG. 1)) may be formed between adjacent stack structures 205 and another conductive material (e.g., the another conductive material 140 (FIG. 1)) may be formed over the dielectric material 130 to form the semiconductor structure 100 as described above with reference to FIG. 1.

Although the first liner 220 and the second liner 224 have been described as being formed in situ (e.g., inside an etch chamber in which the semiconductor structure 200 is patterned), the first liner 220 and the second liner 224 may be formed ex situ (e.g., outside an etch chamber in which the semiconductor structure 200 is patterned).

Accordingly, in one embodiment, a method of forming a semiconductor device comprises forming a first electrode material over a substrate, forming a phase change material comprising a chalcogenide over the first electrode material, doping the phase change material with at least one dopant, forming a second electrode material over the phase change material, removing portions of the first electrode material, the phase change material, and the second electrode material to form adjacent stack structures comprising the first electrode material, the phase change material, and the second electrode material, and forming a liner comprising the at least one dopant on sidewalls of the phase change material.

Forming in situ or ex situ the first liner 220 and the second liner 224 on the stack structures 205 may reduce or prevent undesired chemical and physical interactions between the phase change material 212, the selector device material 208, or both with other materials of the stack structure 205 or the semiconductor structure 200. For example, during formation or etching of one or more materials of the stack structures 205 in conventional methods of fabrication without such liners, chalcogenide-containing materials (e.g., such as those of phase change material 212 or selector device material 208) may interact with etchants, precursor gases, or both, or diffuse from a portion of the stack structure 205. In some instances, the chalcogenide-containing materials may exhibit greater than about a 10% change in composition due to such interactions. However, using the method of the disclosure, the in-situ formed first liner 220 and second liner 224 may preserve the as-formed chalcogenides of the phase change material 212 and the selector device material 208. For example, since the first liner 220 and the second liner 224 are formed in situ, without additional deposition acts, the phase change material 212 and the selector device material 208 are not exposed to deposition temperatures or conditions to form the first liner 220 or the second liner 224. Thus, damage to the chalcogenide materials of the phase change material 212 and the selector device material 208 is minimized. Additionally, since the phase change material 212 and the selector device material 208 are protected by the liners 220, 224, etch chemistries suitable for use in downstream processes may be expanded compared to those suitable for use in conventional methods of fabrication. In addition, the first liner 220 and the second liner 224 exhibit an improved adhesion to sidewalls 222 of the phase change material 212 and the selector device material 208 than conventional liner materials formed by deposition. Further, in use and operation, memory cells comprising the semiconductor structures including the liners described herein exhibit increased refresh speeds and an increased number of cycles before failing.

Figure 4:
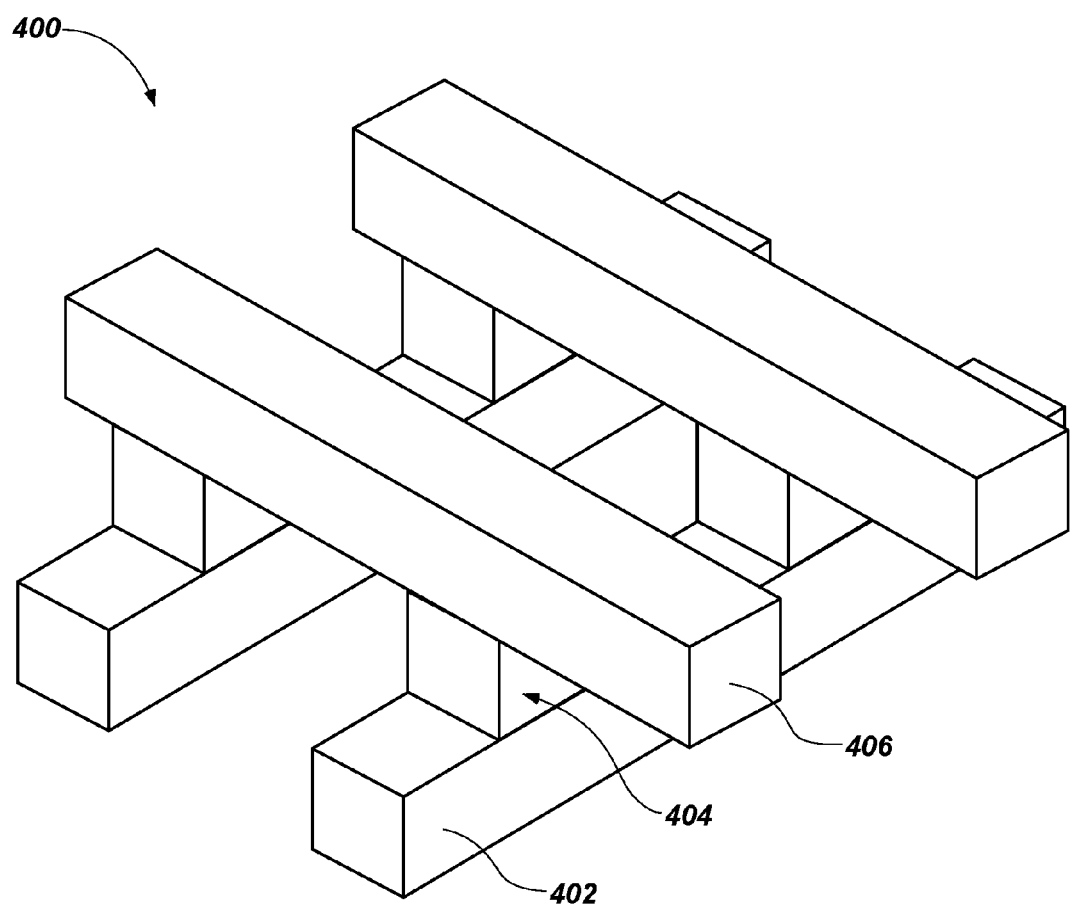
FIG. 4 is a perspective view of a memory cell array including a plurality of memory cells, in accordance with an embodiment of the disclosure.

FIG. 4 illustrates a memory array 400 including a plurality of phase change memory cells 404. The phase change memory cells 404 may be substantially similar to the memory cells 101 described above with reference to FIG. 1. The plurality of phase change memory cells 404 may be positioned between a plurality of access lines 402, sometimes also referred to as word lines 402, and a plurality of bit lines 406, sometimes also referred to as digit lines 406. The plurality of access lines 402 may correspond to the conductive material 104 of FIG. 1 and the plurality of bit lines 406 may correspond to the another conductive material 140 of FIG. 1. The plurality of bit lines 406 may directly overlie a row or column of stack structures and contact the top electrode thereof. Each of the access lines 402 may extend in a first direction and may connect a row of the phase change memory cells 404. Each of the bit lines 406 may extend in a second direction that is at least substantially perpendicular to the first direction and may connect a column of the phase change memory cells 404. A voltage applied to the access lines 402 and the bit lines 406 may be controlled such that an electric field may be selectively applied at an intersection of at least one access line 402 and at least one bit line 406, enabling the phase change memory cells 404 to be selectively operated. Accordingly, a phase change memory device may include a phase change memory array 400.

Figure 5A:
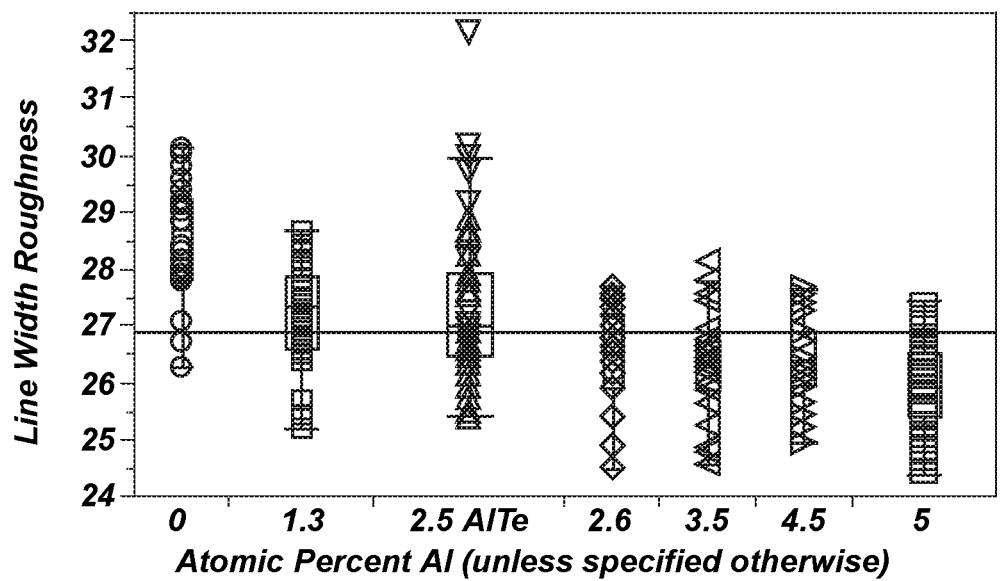
FIG. 5A is a graphical representation of a relationship between a concentration of an aluminum dopant in a chalcogenide material and a degree of variation in a width of a plurality of stack structures.

Stack structures, such as those described above with reference to FIG. 1 may exhibit a nonuniform width. Referring to FIG. 5A, a width of a plurality of stack structures including a GST material doped with aluminum was measured. A graph illustrating a relationship between a uniformity of a width of stack structures to an atomic percent of the aluminum dopant in the as-formed GST material is shown. The y-axis of the graph corresponds to a relative degree of variation in a width of the stack structures. The stack structures may exhibit peaks and valleys that contribute to a nonuniform feature width roughness (e.g., a line width roughness (LWR)). In other words, at various points along a length of the sidewalls of adjacent stack structures, the width of the stack structures may not be substantially uniform. In the graph of FIG. 5A, a greater roughness of the stack structures (i.e., a greater degree of variability in the width of the stack structures) corresponds to a higher value on the y-axis. At increasing aluminum dopant concentrations in the as-formed GST material, the stack structures exhibited a reduced degree of variation in width and a greater uniformity. Thus, forming the stack structures according to the methods described herein may increase a uniformity in a width of the stack structures.

Figure 5B:
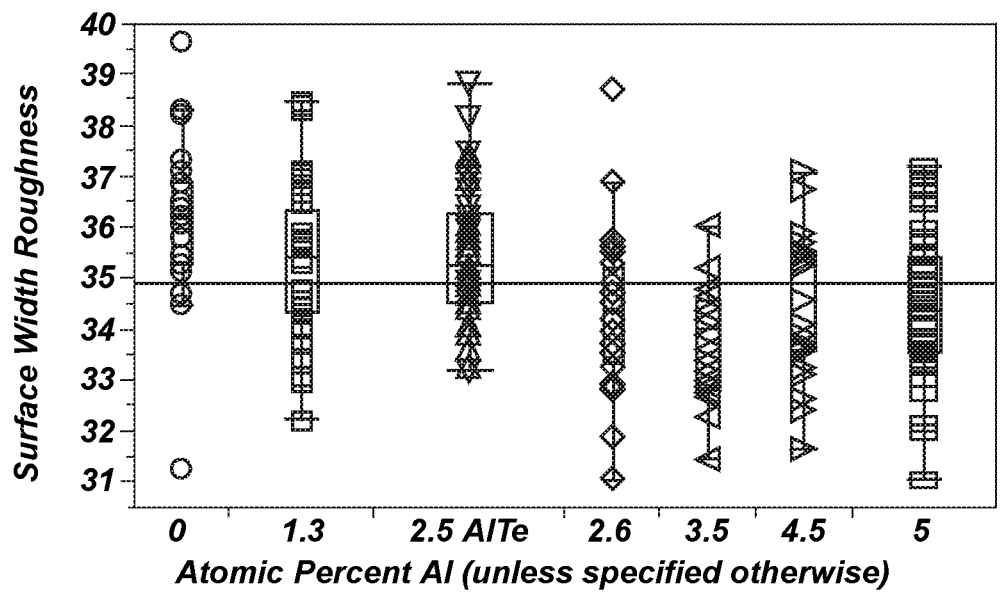
FIG. 5B is a graphical representation of a relationship between a concentration of an aluminum dopant in a chalcogenide material and a degree of variation in surface roughness of a plurality of stack structures.

Referring to FIG. 5B, a graph illustrating a relationship between a uniformity of a profile of sidewalls of the stack structures to an atomic percent of aluminum dopant in the as-formed GST material is shown. The y-axis of the graph illustrates a relative degree of surface roughness of sidewalls of the stack structures, wherein the surface roughness is defined as a difference between a widest width and a narrowest width between sidewalls of adjacent stack structures (e.g., a space width roughness (SWR)). The greater the difference between the widest and narrowest width between the sidewalls, the greater the surface roughness and therefore, the higher the value on the y-axis of the graph of FIG. 5B. At increasing aluminum dopant concentrations in the as-formed GST material, the stack structures exhibited a reduced amount of roughness and a greater uniformity. Accordingly, stack structures formed with the liner may exhibit a reduced amount of roughness and a greater uniformity than stack structures formed without the liners.

Figure 6:
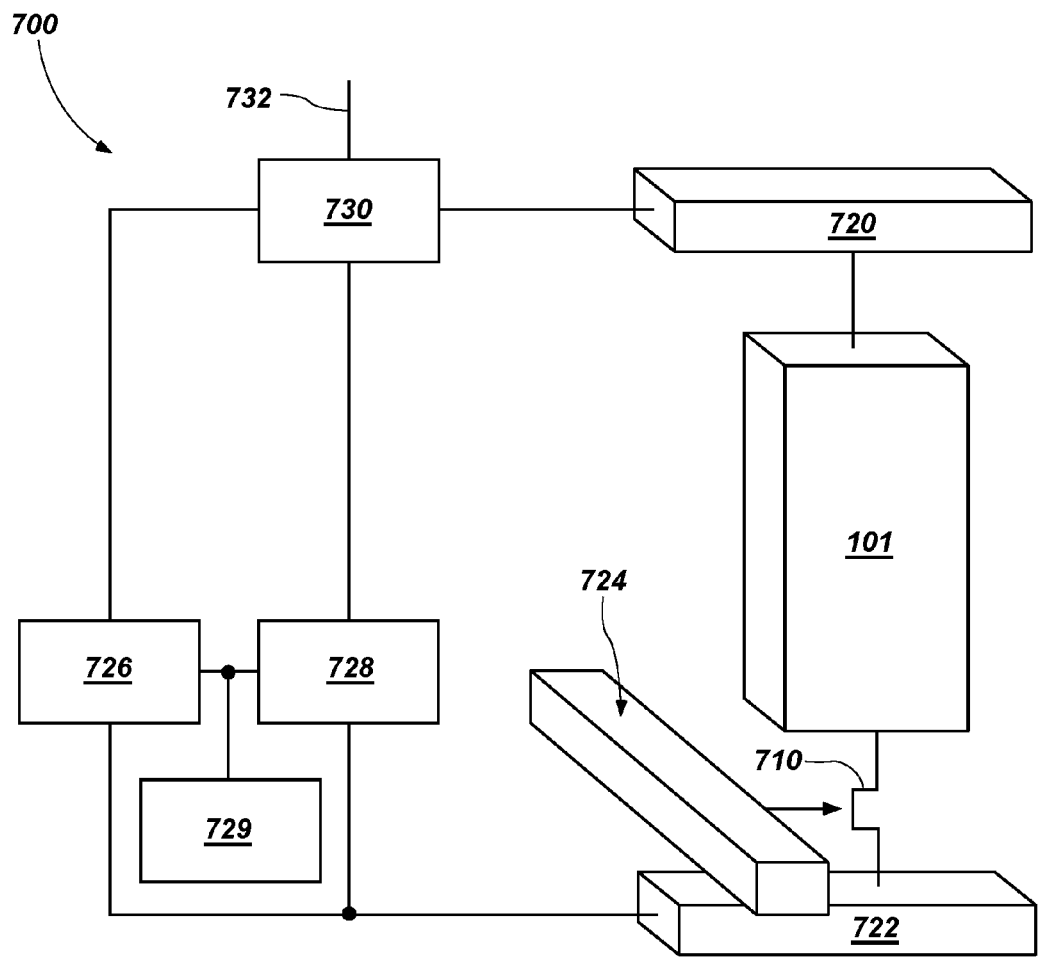
FIG. 6 is a functional block diagram of a semiconductor device, in accordance with an embodiment of the disclosure.

FIG. 6 illustrates a functional block diagram of a semiconductor device 700 in accordance with an embodiment of the disclosure. The semiconductor device 700 may include at least one memory cell 101 between at least one data/sense line, for example, a bit line 720, and at least one source line 722. The memory cell 101 may include a phase change material and a liner on sidewalls thereof and may be substantially similar to the memory cell 101 described above with reference to FIG. 1. The memory cell 101 may be coupled to an access device 710. The access device 710 may act as a switch for enabling and disabling current flow through the memory cell 101. By way of non-limiting example, the access device 710 may be a transistor (e.g., a field-effect transistor, a bipolar junction transistor, etc.) with a gate connected to an access line, for example, a access line 724. The access line 724 may extend in a direction substantially perpendicular to that of the bit line 720. The it line 720 and the source line 722 may be connected to logic for programming and reading the memory cell 101. A control multiplexer 730 may have an output connected to the bit line 720. The control multiplexer 730 may be controlled by a control logic line 732 to select between a first input connected to a pulse generator 726, and a second input connection to read-sensing logic 728.

During a programming operation, a voltage greater than a threshold voltage of the access device 710 may be applied to the access line 724 to turn on the access device 710. Turning on the access device 710 completes a circuit between the source line 722 and the bit line 720 by way of the memory cell 101. After turning on the access device 710, a bias generator 729 may establish, by way of the pulse generator 726, a bias voltage potential difference between the bit line 720 and the source line 722.

During a read operation, the bias generator 729 may establish, by way of the read-sensing logic 728, a read bias voltage potential difference between the bit line 720 and the source line 722. The read bias voltage may be lower than the reset bias voltage. The read bias voltage enables current to flow through the memory cell 101. For example, for a given read bias voltage, if the selector device 108 (FIG. 1) is in a high-resistance state (e.g., a reset state), a relatively smaller current flows through the memory cell 101 than if the selector device 108 is in a low-resistance state (e.g., a set state). The amount of current flowing through the memory cell 101 during the read operation may be compared to a reference input by the read-sensing logic 728 (e.g., a sense amplifier) to discriminate whether the data stored in the resistive memory cell 712 is a logic "1" or a logic "0."

Figure 7:
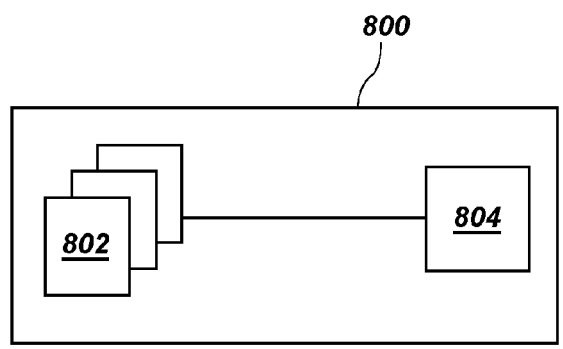
FIG. 7 is a simplified block diagram of a semiconductor device including memory cells having a phase change material and a liner thereon, in accordance with an embodiment of the disclosure.

With reference to FIG. 7, a simplified block diagram of a semiconductor device 800 implemented according to one or more embodiments described herein is illustrated. The semiconductor device 800 includes a memory array 802 and a control logic component 804. The memory array 802 may include a plurality of memory cells 101, as described above with reference to FIG. 1. The control logic component 804 may be configured to operatively interact with the memory array 802 so as to read from or write to any or all memory cells 101 within the memory array 802.

Figure 8:
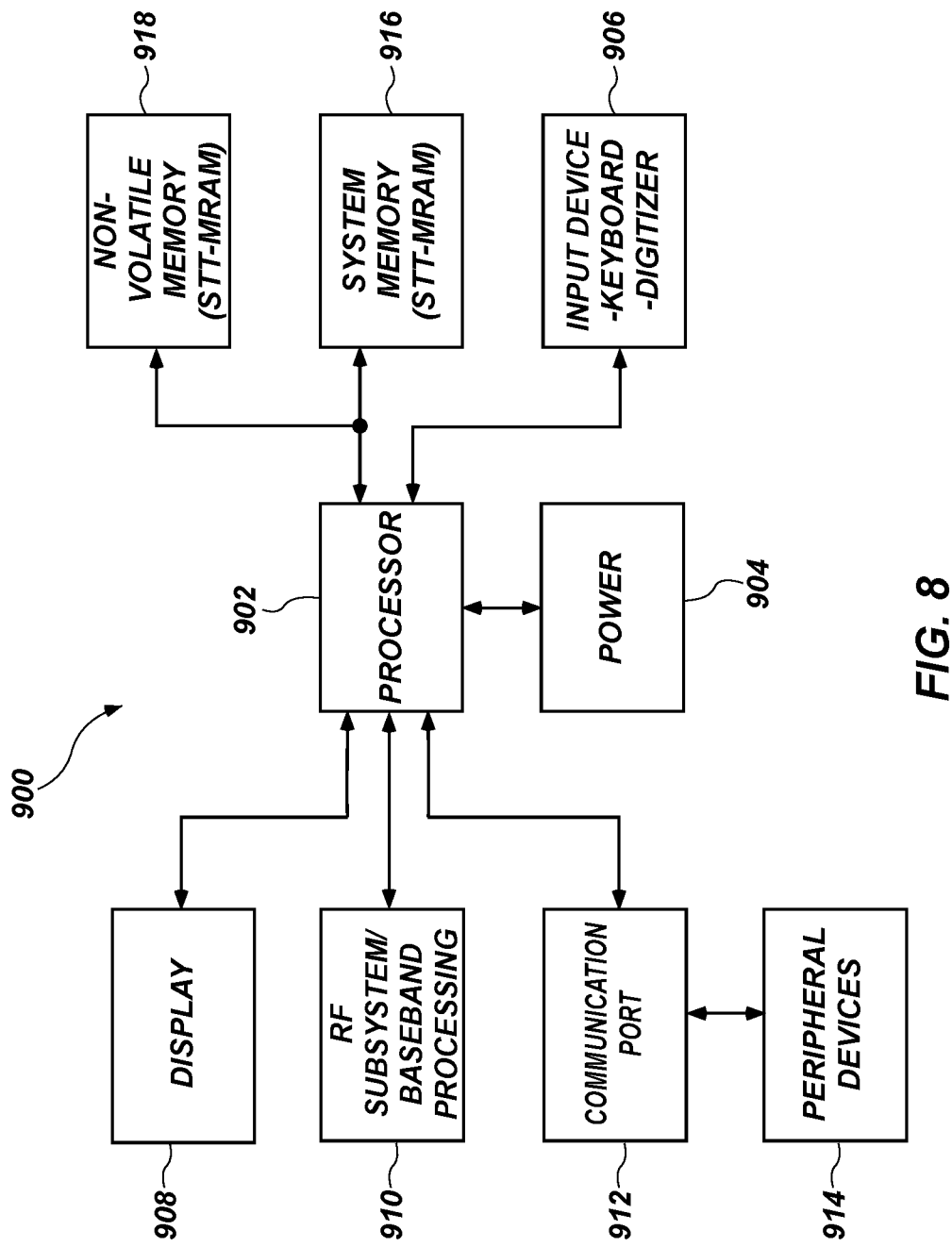
FIG. 8 is a simplified block diagram of a system implemented according to one or more embodiments of the present disclosure.

With reference to FIG. 8, depicted is a processor-based system 900. The processor-based system 900 may include various electronic devices manufactured in accordance with embodiments of the present disclosure. The processor-based system 900 may be any of a variety of types such as a computer, pager, cellular phone, personal organizer, control circuit, or other electronic device. The processor-based system 900 may include one or more processors 902, such as a microprocessor, to control the processing of system functions and requests in the system 900. The processor 902 and other subcomponents of the processor-based system 900 may include memory cells and semiconductor devices manufactured in accordance with embodiments of the present disclosure.

The processor-based system 900 may include a power supply 904 in operable communication with the processor 902. For example, if the processor-based system 900 is a portable system, the power supply 904 may include one or more of a fuel cell, a power scavenging device, permanent batteries, replaceable batteries, and rechargeable batteries. The power supply 904 may also include an AC adapter; therefore, the processor-based system 900 may be plugged into a wall outlet, for example. The power supply 904 may also include a DC adapter such that the processor-based system 900 may be plugged into a vehicle cigarette lighter or a vehicle power port, for example.

Various other devices may be coupled to the processor 902 depending on the functions that the processor-based system 900 performs. For example, a user interface 906 may be coupled to the processor 902. The user interface 906 may include input devices such as buttons, switches, a keyboard, a light pen, a mouse, a digitizer and stylus, a touch screen, a voice recognition system, a microphone, or a combination thereof. A display 908 may also be coupled to the processor 902. The display 908 may include an LCD display, an SED display, a CRT display, a DLP display, a plasma display, an OLED display, an LED display, a three-dimensional projection, an audio display, or a combination thereof. Furthermore, an RF sub-system/baseband processor 910 may also be coupled to the processor 902. The RF sub-system/baseband processor 910 may include an antenna that is coupled to an RF receiver and to an RF transmitter (not shown). A communication port 912, or more than one communication port 912, may also be coupled to the processor 902. The communication port 912 may be adapted to be coupled to one or more peripheral devices 914, such as a modem, a printer, a computer, a scanner, or a camera, or to a network, such as a local area network, remote area network, intranet, or the Internet, for example.

The processor 902 may control the processor-based system 900 by implementing software programs stored in the memory. The software programs may include an operating system, database software, drafting software, word processing software, media editing software, or media playing software, for example. The memory is operably coupled to the processor 902 to store and facilitate execution of various programs. For example, the processor 902 may be coupled to system memory 916, which may include one or more of spin torque transfer magnetic random access memory (STT-MRAM), magnetic random access memory (MRAM), dynamic random access memory (DRAM), static random access memory (SRAM), phase-change memory (PRAM), racetrack memory, and other known memory types. The system memory 916 may include volatile memory, non-volatile memory, or a combination thereof. The system memory 916 is typically large so that it can store dynamically loaded applications and data. In some embodiments, the system memory 916 may include semiconductor devices, such as the semiconductor device 800 of FIG. 7, and memory cells such as the memory cell 101 described above with reference to FIG. 1.

The processor 902 may also be coupled to non-volatile memory 918, which is not to suggest that system memory 916 is necessarily volatile. The non-volatile memory 918 may include one or more of STT-MRAM, MRAM, read-only memory (ROM) such as an EPROM, resistive read-only memory (RROM), and Flash memory to be used in conjunction with the system memory 916. The size of the non-volatile memory 918 is typically selected to be just large enough to store any necessary operating system, application programs, and fixed data. Additionally, the non-volatile memory 918 may include a high capacity memory such as disk drive memory, such as a hybrid-drive including resistive memory or other types of non-volatile solid-state memory, for example. The non-volatile memory 918 may include semiconductor devices, such as the semiconductor device 800 of FIG. 7, and memory cells such as the memory cell 101 described above with reference to FIG. 1.

Accordingly, in one embodiment, a system comprises a processor comprising at least one semiconductor device, the at least one semiconductor device comprising a memory array including a plurality of memory cells, at least one memory cell of the plurality of memory cells comprising a first electrode over a substrate, a phase change material comprising a chalcogenide over the first electrode, a liner on sidewalls of the phase change material, and a dielectric material on sidewalls of the first electrode.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A semiconductor structure comprising:
   a phase change memory cell over a base material, the phase change memory cell comprising a stack structure extending in a direction transverse to the base material, the phase change memory cell comprising:
   a first chalcogenide material comprising one of a phase change material or a select device comprising a switching material over a conductive material;
   a first electrode over the first chalcogenide material;

a second chalcogenide material comprising the other of the phase change material or the select device comprising the switching material over the first electrode, the second chalcogenide material located further from the base material than the first chalcogenide material, at least one of the first chalcogenide material or the second chalcogenide material comprising at least one dopant selected from the group consisting of aluminum, indium, chromium, nickel, zirconium, hafnium, tantalum, and vanadium;

a second electrode over the second chalcogenide material, the first electrode directly contacting the first chalcogenide material and the second chalcogenide material;

a liner on sidewalls of at least one of the first chalcogenide material or the second chalcogenide material, the liner comprising the same element as the at least one dopant of the at least one of the first chalcogenide material or the second chalcogenide material, wherein the liner comprises a higher atomic percent of oxygen at an exposed surface thereof than at locations proximate the at least one of the first chalcogenide material or the second chalcogenide material, the exposed surface of the liner comprising an oxide of the at least one dopant; and a dielectric material over and in contact with sidewalls of the first electrode and in contact with the liner.

2. The semiconductor structure of claim 1, wherein the liner comprises an oxide of the at least one dopant of the at least one of the first chalcogenide material or the second chalcogenide material.

3. The semiconductor structure of claim 1, wherein the liner comprises aluminum telluride.

4. The semiconductor structure of claim 1, wherein at least one of the first chalcogenide material or the second chalcogenide material comprises GST.

5. The semiconductor structure of claim 1, wherein the at least one dopant comprises aluminum.

6. The semiconductor structure of claim 1, wherein the liner is on sidewalls of the first chalcogenide material and the second chalcogenide material and does not contact the first electrode.

7. A method of forming a semiconductor device, the method comprising:

forming a memory array comprising memory cells extending in a direction transverse to a base material, forming the memory array including forming at least one memory cell of the memory cells, wherein forming the at least one memory cell of the memory cells comprises:

forming a first chalcogenide material comprising one of a phase change material or a select device comprising a switching material over a conductive material;

forming a first electrode material over the first chalcogenide material;

forming a second chalcogenide material comprising the other of the phase change material or the select device comprising the switching material over the first electrode, the second chalcogenide material located further from the base material than the first chalcogenide material, at least one of the first chalcogenide material and the second chalcogenide material comprising at least one dopant selected from the group consisting of aluminum, indium, chromium, nickel, zirconium, hafnium, tantalum, and vanadium;

forming a second electrode material over the second chalcogenide material and located vertically between the first chalcogenide material and the second chalcogenide material, wherein the first electrode material directly contacts the first chalcogenide material and the second chalcogenide material;

removing portions of the first chalcogenide material, the first electrode material, the second chalcogenide material, and the second electrode material to form a stack structure comprising the first chalcogenide material, the first electrode material, the second chalcogenide material, and the second electrode material;

forming a liner on sidewalls of at least one of the first chalcogenide material or the second chalcogenide material, the liner comprising the same element as the at least one dopant of the at least one of the first chalcogenide material or the second chalcogenide material, the liner comprising a higher atomic percent of oxygen at an exposed surface thereof than at locations proximate the at least one of the first chalcogenide material or the second chalcogenide material, the exposed surface of the liner comprising an oxide of the at least one dopant; and forming a dielectric material over and in contact with sidewalls of the first electrode and in contact with the liner.

8. The method of claim 7, wherein forming a liner on sidewalls of at least one of the first chalcogenide material or the second chalcogenide material comprises diffusing the at least one dopant from the at least one of the first chalcogenide material or the second chalcogenide material to sidewalls of the at least one of the first chalcogenide material or the second chalcogenide material.

9. The method of claim 7, further comprising oxidizing the at least one dopant on the sidewalls of the at least one of the first chalcogenide material or the second chalcogenide material.

10. The method of claim 7, wherein forming a liner on sidewalls of at least one of the first chalcogenide material or the second chalcogenide material comprises re-sputtering the at least one dopant of the at least one of the first chalcogenide material or the second chalcogenide material on sidewalls of the at least one of the first chalcogenide material or the second chalcogenide material while removing portions of the at least one of the first chalcogenide material or the second chalcogenide material.

11. The method of claim 7, further comprising selecting the at least one dopant to comprise aluminum or aluminum telluride.

12. The method of claim 7, wherein forming a liner on sidewalls of at least one of the first chalcogenide material or the second chalcogenide material comprises forming a liner on each of the first chalcogenide material and the second chalcogenide material.

13. The method of claim 7, wherein removing portions of the first chalcogenide material, the first electrode material, the second chalcogenide material, and the second electrode material and forming a liner on sidewalls of at least one of the first chalcogenide material or the second chalcogenide material occur simultaneously.

14. The semiconductor structure of claim 1, wherein the liner on sidewalls of at least one of the first chalcogenide material or the second chalcogenide material comprises a first liner on sidewalls of the first chalcogenide material and a second liner on sidewalls of the second chalcogenide material, wherein the first liner and the second liner have a different thickness.

15. The semiconductor structure of claim 1, wherein the at least one dopant is selected from the group consisting of aluminum telluride, indium, chromium, nickel, zirconium, hafnium, and vanadium.

16. The semiconductor structure of claim 1, wherein a lateral distance between an outer surface of the liner of the phase change memory cell and an outer surface of a corresponding liner of an adjacent phase change memory cell is less than a lateral distance between an outer surface of the first electrode and an outer surface of a corresponding first electrode of the adjacent phase change memory cell.

17. The semiconductor structure of claim 1, wherein sidewalls of the first electrode are substantially coplanar with sidewalls of the first chalcogenide material.

18. The semiconductor structure of claim 1, wherein a concentration of the at least one dopant in the at least one of the first chalcogenide material or the second chalcogenide material is between about 1.0 atomic percent and about 3.0 atomic percent.

19. The semiconductor structure of claim 1, wherein a concentration of the at least one dopant in the at least one of the first chalcogenide material or the second chalcogenide material is between about 3.0 atomic percent and about 5.0 atomic percent.

20. The semiconductor structure of claim 1, wherein:
the liner is on sidewalls of the first chalcogenide material and the second chalcogenide material and does not contact the first electrode; and
the liner on sidewalls of the first chalcogenide material has a different concentration of the material of the at least one dopant than the liner on the sidewalls of the second chalcogenide material.

21. A semiconductor structure, comprising:
a phase change memory cell over a base material, the phase change memory cell comprising a stack structure extending in a direction transverse to the base material, the phase change memory cell comprising:
a first chalcogenide material comprising one of a phase change material or a select device comprising a switching material over a conductive material;
a first electrode over the first chalcogenide material;
a second chalcogenide material comprising the other of the phase change material or the select device comprising the switching material over the first electrode, the second chalcogenide material located further from the base material than the first chalcogenide material, the first chalcogenide material and the second chalcogenide material comprising at least one dopant selected from the group consisting of aluminum, indium, chromium, nickel, zirconium, hafnium, tantalum, and vanadium;
a second electrode over the second chalcogenide material, the first electrode directly contacting the first chalcogenide material and the second chalcogenide material;
a liner on sidewalls of the first chalcogenide material and the second chalcogenide material, the liner comprising the same element as the at least one dopant, wherein:
the liner does not contact the first electrode or the second electrode; and
the liner on sidewalls of the first chalcogenide material has a different concentration of the material of the at least one dopant than the liner on the sidewalls of the second chalcogenide material; and
a dielectric material over and in contact with sidewalls of the first electrode and in contact with the liner.

* * * * *

UNITED STATES PATENT AND TRADEMARK OFFICE
CERTIFICATE OF CORRECTION

| | |
|---|---|
| PATENT NO. | : 10,256,406 B2 |
| APPLICATION NO. | : 15/155618 |
| DATED | : April 9, 2019 |
| INVENTOR(S) | : Dale W. Collins et al. |

Page 1 of 1

It is certified that error appears in the above-identified patent and that said Letters Patent is hereby corrected as shown below:

In the Specification

| | | |
|---|---|---|
| Column 3, | Line 13, | change "the team "nitrided"" to --the term "nitrided"-- |
| Column 10, | Line 4, | change "formed situ" to --formed *in situ*-- |
| Column 12, | Line 29, | change "(e.g. the" to --(e.g., the-- |
| Column 14, | Line 40, | change "The it line" to --The bit line-- |
| Column 15, | Line 24, | change "in the system" to --in the processor-based system-- |

Signed and Sealed this
Seventh Day of May, 2019

Andrei Iancu
*Director of the United States Patent and Trademark Office*